Figure 1:
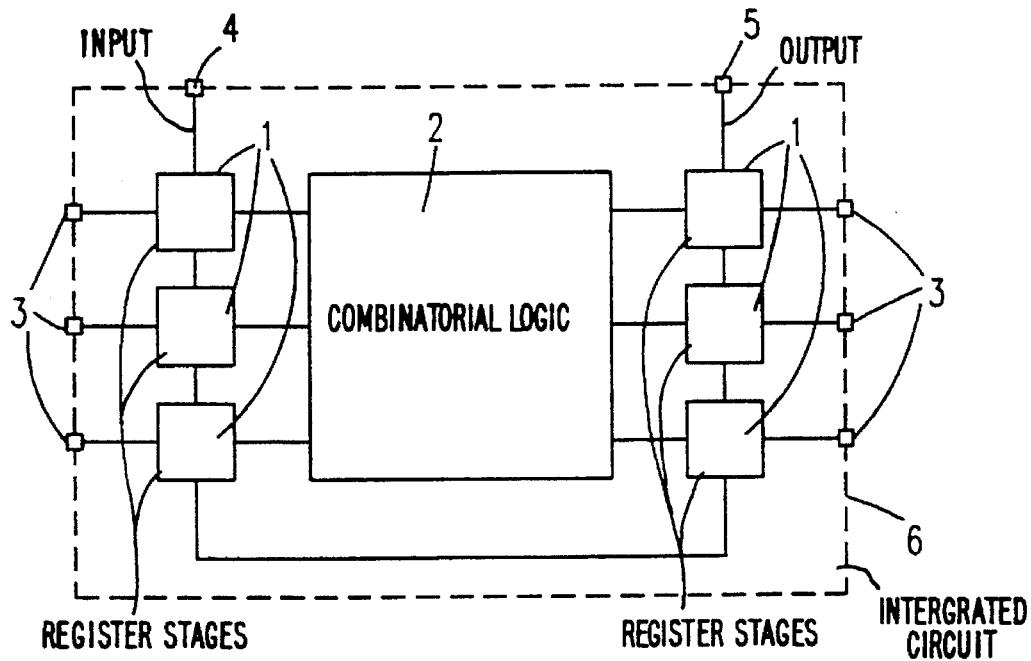

United States Patent [19]
Scheuermann et al.

[11] Patent Number: 5,491,699
[45] Date of Patent: Feb. 13, 1996

[54] REGISTER STAGE HAVING AT LEAST TWO MEMORY STAGES FOR COORDINATING DISPARATE CLOCK SIGNALS FOR USE IN BOUNDARY SCAN

[75] Inventors: Kurt Scheuermann; Harald Ebert, both of Nürnberg, Germany

[73] Assignee: U.S. Philips Corporation, New York, N.Y.

[21] Appl. No.: 253,040

[22] Filed: Jun. 2, 1994

[30] Foreign Application Priority Data

Jun. 3, 1993 [DE] Germany ............... 43 18 422.7

[51] Int. Cl.⁶ ............................. G01R 31/3185
[52] U.S. Cl. ............ 371/22.1; 371/22.3; 371/22.5
[58] Field of Search ............... 371/22.1, 22.2, 371/22.3, 22.4, 22.5, 22.6

[56] References Cited

U.S. PATENT DOCUMENTS

| | | | |
|---|---|---|---|
| 4,277,699 | 7/1981 | Brown et al. | 307/272 |
| 4,441,075 | 4/1984 | McMahon | 324/73 R |
| 4,554,466 | 11/1985 | Dillon | 307/272 |
| 4,580,137 | 4/1986 | Fiedler et al. | 340/825.68 |
| 4,698,588 | 10/1987 | Hwang et al. | 324/73 R |
| 4,701,920 | 10/1987 | Resnick et al. | 371/25 |
| 4,852,061 | 7/1989 | Baron et al. | 365/154 |
| 4,862,068 | 8/1989 | Kawashima et al. | 324/73 R |
| 4,945,536 | 7/1990 | Hancu | 371/22.3 |
| 5,032,783 | 7/1991 | Hwang et al. | 324/73.1 |
| 5,130,568 | 7/1992 | Miller et al. | 307/272.2 |
| 5,150,366 | 9/1992 | Bardell, Jr. et al. | 371/22.3 |
| 5,349,587 | 9/1994 | Nadeau-Dostie et al. | 371/22.3 |
| 5,381,420 | 1/1995 | Henry | 371/22.3 |
| 5,386,392 | 1/1995 | Cantiant et al. | 365/233 |
| 5,390,190 | 2/1995 | Nanda et al. | 371/22.3 |

OTHER PUBLICATIONS

IBM Technical Disclosure, "Use of Transparent Shift Register Latches in LSSD Circuit Designs", Oct. 1989.
"Electronik", No. 21 of 14.11.1988, pp. 161–166.

*Primary Examiner*—Emanuel T. Voeltz
*Assistant Examiner*—Patrick J. Assouad
*Attorney, Agent, or Firm*—Anne E. Barschall

[57] ABSTRACT

For testing an integrated circuit with sequential logic its register stages are arranged in series as a shift register. This may give rise to delay time problems, which can be avoided by two-phase operation of the register stages, as is the case in, for example, the known LSSD technology. However, for a high processing speed edge-clocked register stages are more favorable. The invention therefore proposes register stages which can readily be switched between two-phase operation during testing and edge control in normal operation. For this only one additional clock line is required.

6 Claims, 3 Drawing Sheets

REGISTER STAGE HAVING AT LEAST TWO MEMORY STAGES FOR COORDINATING DISPARATE CLOCK SIGNALS FOR USE IN BOUNDARY SCAN

The invention relates to an integrated circuit comprising a plurality of clocked register stages each having at least a clock input, a data input and an output, an edge of pulses applied to the clock input causing a signal applied to the data input to be stored and to be supplied to the output.

After their fabrication integrated circuits should be tested for their correct operation. In the case of purely combinatorial circuits, even if they are extensive, this is not too difficult because even in the case of a multiplicity of inputs the number of possible signal combinations is limited. However, in the case of sequential circuits this is no longer the case because these include storage elements, as a result of which the signals at the outputs depend not only on the test pattern instantaneously applied to the inputs but also on preceding states. As a consequence, the number of signal combinations in the test patterns becomes so large that a complete test of the integrated circuit requires so much time that is no longer economical. For this reason various test methods have been developed in the past in order to enable also sequential logic circuits to be tested as fully as possible or fully. The best-known methods are the so-called boundary-scan methods, which are based on the fact that all the storage elements such as register stages can be set to a special test mode in which all these stages are arranged in series as a shift register. As a result, the register stages can be loaded serially with test patterns which can be read out directly to check the operation of the register stages themselves and, in addition, the register stages can be loaded with test patterns which drive the combinatorial parts of the entire integrated circuit which are connected to the register stages, the signals produced by these combinatorial circuit parts being loaded into register stages for example for subsequent serial read-out.

Such methods are described in, for example, the magazine "Electronik", No. 21 of 14.10.1988, pp. 161 to 166. This magazine inter alia describes a version in which each register element is followed by a so-called latch and an additional control line has been provided to switch the entire circuit between a test mode and normal operation.

An integrated circuit frequently comprises two or more groups of registers operated via separate clock lines, i.e. the integrated circuit has a plurality of internal clock systems. However, for the test mode all the register stages are connected in a common arrangement and controlled with the same clock signal. As a result, the situation may arise that the active edge of a clock pulse for two directly succeeding register stages exhibit larger delays than the data connection of the two register stages, so that a correct shift-register operation is not possible at least without any further steps.

In order to preclude these problems it is known, for example from the afore-mentioned document, to employ the so-called LSSD method or level-sensitive design method. The register stages are then no longer edge-clocked, but instead use is made of two clock phases with non-overlapping pulses, each register stage having two sections which become operative one after the other. However, this principle has the drawback that in normal operation such register stages operate more slowly than edge-clocked register stages.

Therefore, U.S. Pat. No. 4,277,699 describes such a clock-phase controlled register stage which can be switched from operation with two clock phases for test purposes to a kind of edge-clocked mode for normal operation. This requires three clock signals in total and the circuit is of complex construction and does not operate very rapidly. This also applies to a modification of such a register stage described in U.S. Pat. No. 4,554,466.

It is an object of the invention to provide an integrated circuit with edge-clocked register stages of the type defined in the opening paragraph, in which the individual register stages are of simple construction and operate rapidly and which nevertheless permits a simple and reliable test mode to be realised.

According to the invention this object is achieved in that each register stage comprises a series arrangement of an edge-triggered memory stage and a level-triggered memory stage, each having at least a clock input, a data input and an output, and in that the data input of the first memory stage of the series arrangement is preceded by a first multiplexer having a select input, at least two data inputs and a data output, wherein during testing of the integrated circuit the edge-triggered memory stages of the register stages receive the same first clock signal on the clock input, and the level-triggered memory stages of the register stages receive the same second clock signal, both clock signals having non-overlapping pulses, and for loading and reading-out test signal patterns the first multiplexer receives a first select signal on its select input in order to connect a dam input for test signals to its data output, and wherein in normal operation constantly a first signal value is applied to the clock input of the level-clocked memory stage of the register stages to switch said memory stage to transparent operation.

With this solution the edge-triggered memory stage used for normal operation is merely arranged in series with a simple level-triggered memory stage, which in normal operation is simply switched to transparent operation by means of an appropriate signal on the clock input and thus becomes hardly active any longer, except for the fact that it causes a slight increases of the overall delay in the register stage. Particularly if a complex logic circuit is designed by CAE means, while initially only edge-triggered memory stages are used, such a design can readily be modified for test purposes.

In accordance with the invention another solution of said problem is characterised in that each register stage comprises two series-connected level-triggered memory stages each having at least one clock input, a data input and an output, in that the data input of the first memory stage of the series arrangement is preceded by a first multiplexer having a select input, at least two data inputs and a data output, and in that the clock input of the second memory stage is preceded by a second multiplexer having a select input, at least two data inputs and a data output, wherein during testing of the integrated circuit the first memory stages of the register stages receive the same first clock signal on their clock inputs, and the second multiplexers of the register stages receive the same second clock signal on a first clock input, both clock signals having non-overlapping pulses, and for loading and reading-out test signal patterns the first multiplexer receives a first select signal on its select input in order to connect a data input for test signals to its data output, and the second multiplexer receives a second select signal on its select input in order to connect the first clock input to its clock output, and wherein in normal operation the second multiplexer receives the inverse first clock signal on a second clock input and the inverse second select signal on its select input in order to connect the second clock input to its clock output.

Now two level-triggered memory stages are used which in normal operation are clocked by two mutually inverted clock signals and which consequently respond as an edge-triggered register stage. In the test mode, however, the two memory stages are clocked by means of two separate clock signals having non-overlapping pulses. Owing to the second multiplexer before the clock input of the second memory stage this stage will exhibit another delay for the clock signal than the first memory stage but this difference will have no adverse effect if the circuit is designed and manufactured with care.

In accordance with the invention a third solution of said problem is characterised in that each register stage comprises two series-connected level-triggered memory stages each having at least one clock input, a data input and an output, in that there has been provided a third similar memory stage whose data input is preceded by a first multiplexer having a select input, at least two data inputs and a data output, of which a first data input is connected to the data input of the first memory stage, and in that there has been provided a second multiplexer having a select input, two data inputs connected to the output of the first and the third memory stage, respectively, and a data output connected to the data input of the second memory stage, wherein during testing of the integrated circuit the second memory stages of the register stages receive the same first clock signal on the clock input and the third memory stages of the register stages receive the same second clock signal on the clock input, both clock signals having non-overlapping pulses, and for loading and reading-out test signal patterns the first and the third multiplexer preferably receive a similar first select signal on the select input in order to couple a data input for test signals to the data input of the third memory stage, and to couple the output of the third memory stage to the data input of the second memory stage, and for loading test results the first select signal is inverted at least for the pulse duration of the second clock signal and is not inverted at least for the pulse duration of the first clock signal, and wherein in normal operation the first memory stage receives the inverse first clock signal on its clock input and the second multiplexer receives the inverse select signal, in order to couple the output of the first memory stage to the data input of the second memory stage.

This solution also uses two level-clocked memory stages which in normal operation are clocked by two mutually inverted clock signals and which consequently behave as an edge-triggered register stage. In addition a third memory stage is employed which is operative only for the test mode, the third and the second memory stage receiving clock pulses having non-overlapping pulses. Instead of the clock multiplexer this solution utilises a data multiplexer between the first and the second memory stage and the third and the second memory stage.

A common feature of all three solutions is that in the normal mode of operation the register stages are edge-triggered and in the test mode a reliable two-phase control is applied, the clock signal used in normal operation being also used in the test mode and, as consequence, being also tested. The two-phase control in the test mode also enables a reliable shift register to be obtained when a plurality of clock systems are used in normal operation and precludes delay time problems in the case of internal feedback from register stages via combinatorial circuit parts.

An embodiment of the invention providing a particularly simple construction of the level-clocked memory stages is characterised in that each level-triggered memory stage comprises the series arrangement of a fourth multiplexer, a first and a second inverter, the fourth multiplexer having two inputs, one input being connected to the output of the second inverter and the other input to a data input, having a control input connected to a clock input, and having an output connected to the input of the first inverter. A memory stage of this construction also exhibits only a small delay, for example when it is constantly switched to transparent operation by an appropriate clock signal.

Figure 2:
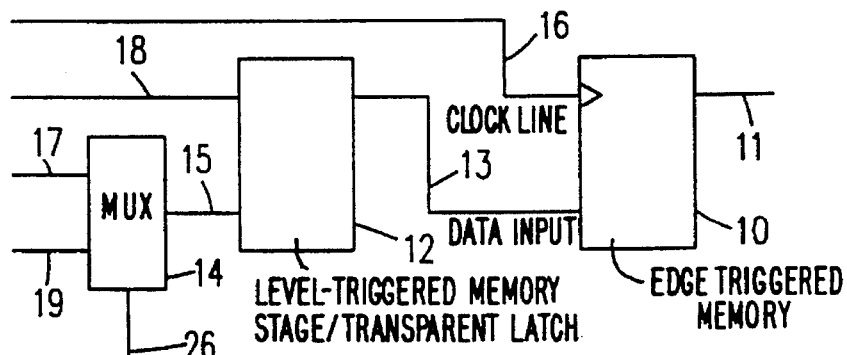
Figure 3:
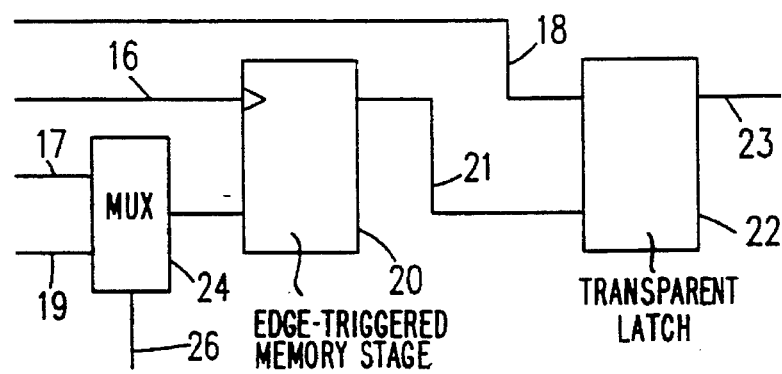
Figure 4:
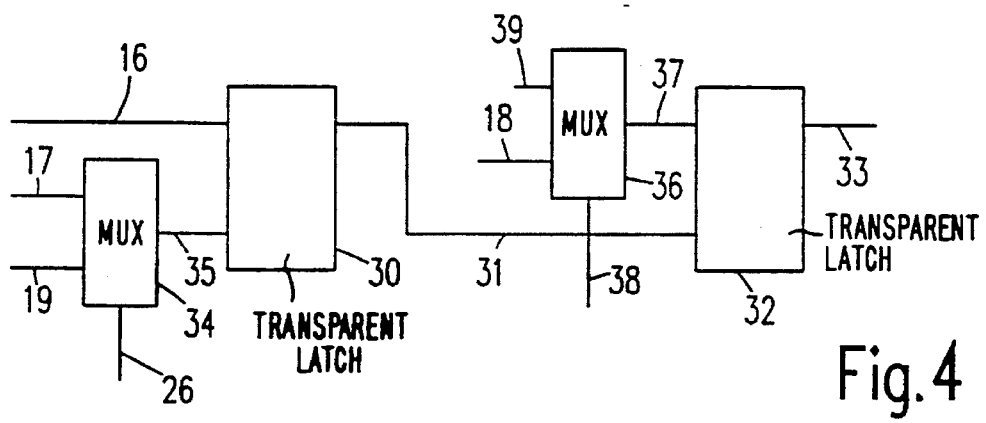
Figure 5:
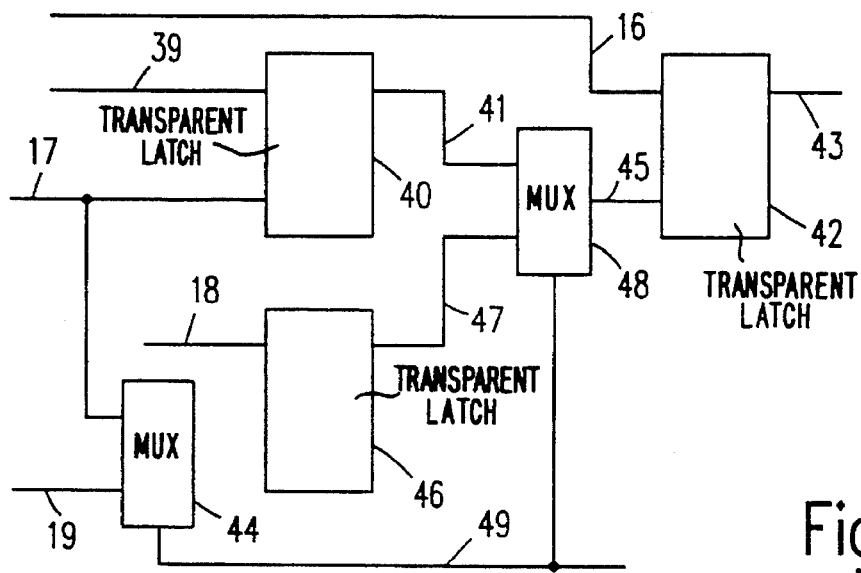
Figure 7:
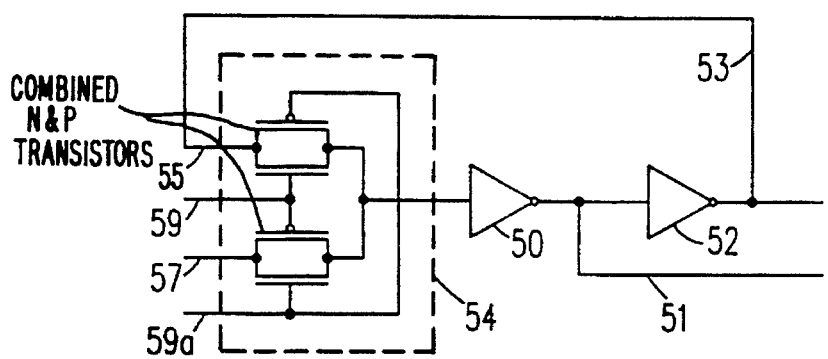
Figure 8:
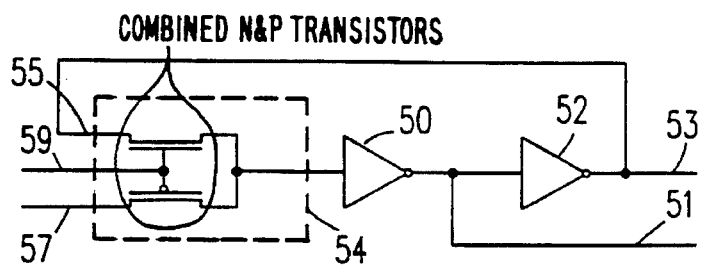
Figure 6A:
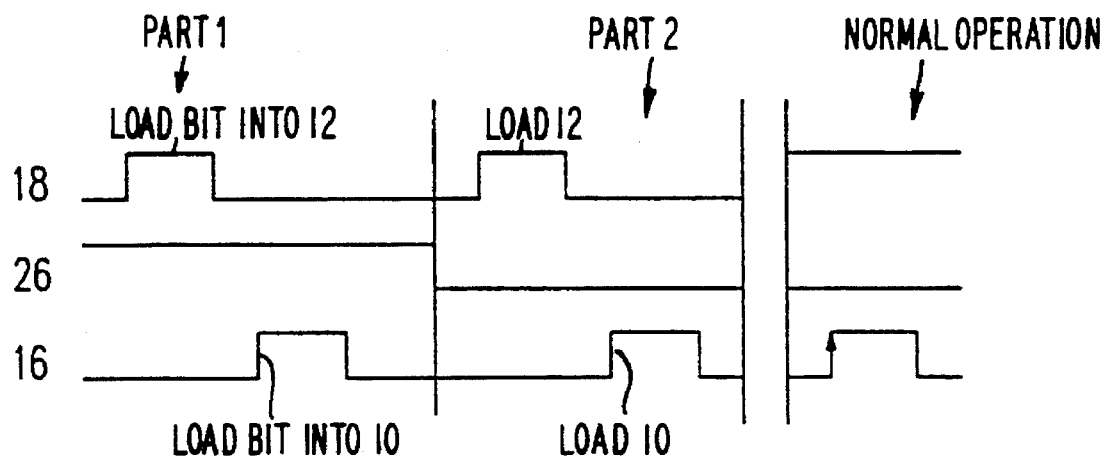
Figure 6B:
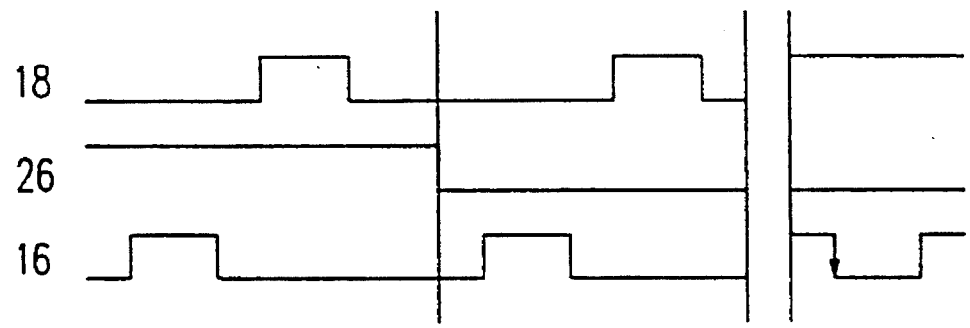
Figure 6C:
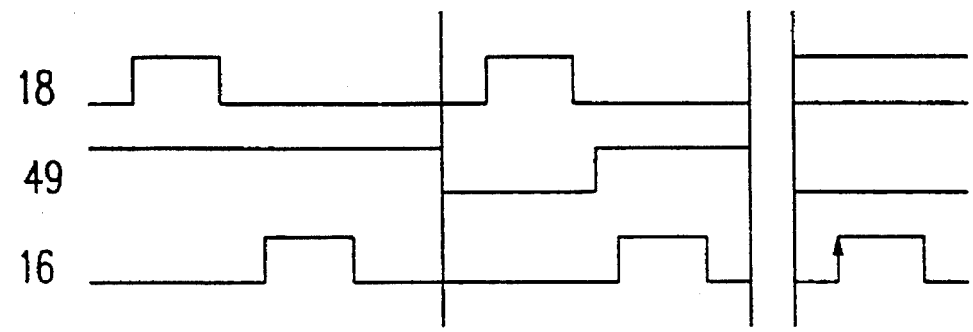

Exemplary embodiments of the invention will now be described in more detail with reference to the drawings. In the drawings FIG. 1 Shows diagrammatically the construction of an integrated circuit with sequential logic in the test mode, FIGS. 2 and 3 show two possibilities for the series arrangement of an edge-clocked and a level-triggered memory stage, FIG. 4 shows a register stage comprising two level-triggered memory stages with a clock multiplexer, FIG. 5 shows a register stage comprising three level-triggered memory stages and a further data multiplexer, FIG. 6a–6c shows some pulse diagrams for the operation of the memory stages shown, FIGS. 7 and 8 show two examples of the construction of a level-triggered memory stage.

FIG. 1 shows diagrammatically an integrated circuit 6 which includes a sequential logic circuit. The storage elements of this circuit are represented are shown as register stages 1 arranged in series as a shift register for the test mode. A serial test pattern is applied via an input 4 and is shifted through the register stages 1 by means of a clock signal, not shown, after which it appears on an output terminal 5. The combinatorial pans of the logic circuit which are connected to the register stages are shown in simplified form as a block 2, which in the present case is connected to the respective outputs and inputs of the register stages 1. For normal operation the inputs and outputs of the register stages 1 also have external connections via terminals 3.

In the test mode a test pattern is applied via the input terminal 4 and is shifted through all the register stages 1 until the entire test pattern appears on the output terminal 5, in order to check whether all the register stages operate correctly. Then, a test pattern is loaded in such a manner that all the register stages exhibit a desired signal state, which may of course be different for the individual register stages, after which the output signals of the combinatorial parts 2 of the logic circuit are loaded into the register stages 1 by appropriate control and subsequently this result is shifted through the register stages I and is taken from the output terminal 5 for comparison with a given result. Subsequently, further different test patterns have to be loaded into the register stages I and the relevant results have to be read out for a substantially complete test of the integrated circuit 6. However, it is also possible to use at least one of the result signal patterns as a test patterns for the next test cycle in order to avoid frequent shifting of the signal patterns through the series-connected register stages 1. Other forms of the test or of the generation and read-out of the test patterns using the series-connected register stages forming a shift register are also customary.

The register stages 1 are frequently implemented as edge-triggered register stages which on a given edge of a clock pulse, for example the leading edge, load a signal present on a data input when this clock edge appears and transfer this signal to their outputs. Changes of the signal on the data input before and after this clock edge have no effect. However, in the system shown in FIG. 1 problems arise when the same clock signal is not applied directly to the individual register stages but particularly when different clock systems are used in normal operation and have to be combined in the test mode via additional logic circuits. Moreover, the situation may arise that a register stage driving a combinatorial part of the logic circuit is loaded with a result signal from this or another combinatorial circuit part and changes its signal state, so that now a different signal is fed into the corresponding combinatorial circuit part. If this part influences the input signal of another register stage and this stage receives the clock signal delayed by logic elements in the clock line this other register stage may be loaded with an incorrect result. This means that special requirements are imposed on the register stages, particularly as regards the change-over between the test mode and normal operation.

FIG. 2 shows a register stage which is suitable for this purpose. It comprises an edge-triggered memory stage 10, which may be of customary construction, for example as integrated flip-flop circuits designated 74HC74. Such a memory stage has a data input connected to a line 13, a clock input connected to a clock line 16, and at least one output connected to a line 11. Such memory stages frequently also have complementary outputs.

The edge-clocked memory stage 10 is preceded by a level-triggered memory stage 12, which also has a data input connected to a line 15, a clock input connected to a line 18, and an output connected to the line 13. Such a memory stage has the feature that the data signal from the line 15 is passed directly to the output 13 for one value, for example the high signal value, of the clock signal on the line 18, said output following each change of the data signal on the data input. Such a memory stage is therefore also referred to as a "transparent latch". When the clock signal changes to the other signal value the instantaneous signal state is maintained and the data signal on the output is then independent of signal changes at the data input.

The memory stage 12 is further preceded by a multiplexer 14 which passes the signal on one of two data inputs 17 and 19 to the output 15 depending on the signal on a select input, which is applied via a line 26.

The operation of such a register stage will now be described in greater detail with reference to the diagram in FIG. 6a. This diagram shows three different operating cycles, the three signal waveforms bearing the reference numerals of the corresponding line in FIG. 2. In the first cycle, a test pattern is loaded serially into a chain of registers, which are arranged in series as a shift register in this test mode. For this purpose the line 26 receives a high signal as the select signal for the multiplexer 14, causing the data input 19 to be connected to the output 15. This data input 19 is connected to the output of the preceding register stage and in the case of the first register stage of the chain it is connected to the terminal 4 in FIG. 1. The first pulse on the clock line 18 loads the first bit into the memory stage 12 and stores it there before the first pulse appears on the clock line 16, the data signal on the line 13 being loaded into the memory, stage 10 and appearing on the output 11 on the leading edge of this first pulse on the clock line 16. Changes of the signal on the dam line 19 and on the line 15 coupled thereto have no effect between the end of the pulse on the line 18 and the leading edge of the pulse one the line 16, so that different delays of the clock signal on the line 16 between different register stages are completely harmless. Since the two clock signals on the lines 16 and 18 are applied from sources external to the integrated circuit the pulse spacing can be adjusted as required.

The second part of FIG. 6a shows the process during the transfer of a test result from a combinatorial part of the logic circuit connected to the register stage. The line 26 first receives a low signal, as a result of which the multiplexer 14 couples the output of the combinatorial circuit part to the line 15 and, consequently, to the data input of the memory stage 12. With the pulse on the line 18 the output signal of the combinatorial circuit part is loaded into the memory stage 12 and appears on the line 13. With the leading edge of the next pulse on the line 16, which appears some time after the end of the pulse on the line 18 in order to allow for signal delays, the result generated previously by the combinatorial circuit part and buffered in the memory stage 16 is transferred to the memory stage 12 and appears on the output 11. This result can be shifted through the chain of register stages to the output 5 in FIG. 1 by switching back to the signal sequence in the first part of FIG. 6a.

The last part of FIG. 6a shows the signal condition in normal operation, where the signal on the line 18 is constantly high so that the memory stage 12 constantly operates in a transparent mode and the signal on the line 26 is constantly low, as a result of which the normal data input 17 is coupled to the line 13 via the multiplexer 14 and the memory stage 12.

As a result, the leading edge of the pulse on the clock line 16 directly loads the signal on the data line 17 into the memory stage 10, which signal appears immediately on the output 11, i.e. the register stage operates as desired in the normal mode of operation as a simple edge-clocked memory stage.

If, however, the signal on the clock line 18 is constantly held low temporarily the memory stage 12 keeps the last state on the data line 17 and the memory stage 10 subsequently maintains this state and no longer responds to signal changes on the data line 17. This may be important for a low-power standby mode because then no more signal variations will occur in the register stage so that this stage consumes hardly any power.

The register stage shown in FIG. 3 is of a construction similar to that in FIG. 2. The difference basically resides in the interchange of the two memory stages, i.e. an edge-triggered memory stage 20 is followed by a level-triggered memory stage 22. The construction of the two memory stages and of the multiplexer 24, which is now connected to the data input 25 of the memory stage 20, may be similar to that of the corresponding stages in FIG. 2.

The change of the sequence of the two memory stages leads to a slightly different drive, which is shown in FIG. 6b. In the test mode (in the first part of FIG. 6b) after application of a new bit of a test pattern a pulse is produced on the clock line 16, upon which this bit is loaded into the memory stage 20 and appears on the line 21. In the meantime the previous signal state on the output 23 of the memory stage 22 remains stable so that no problems arise even if the delay times of the clock signal on the line 16 differ from one another for different register stages. A clock pulse with which the signal state on the line 21 is transferred to the output will not appear on the line 18 before an appropriate time interval, which allows for the maximum delay times, has elapsed after the appearance of the clock pulse on the line 16. Possible changes of the data signal which may now occur can have no effect on the state of the memory stage 20 and, consequently, on the output 23.

When a test result of a combinatorial circuit pan is transferred to a register stage the same process occurs as described with reference to FIG. 2, but now it is merely required that, after the change of state of the select signal on the line 26 for the multiplexer 24, first a pulse appears on the clock line 16 and subsequently a pulse appears on the clock line 18.

In normal operation a high signal on the clock line 18 makes the memory stage 22 operate constantly in a transparent mode, so that a data signal from the memory stage 20 appears not only on the line 21 but also on the output 23 after a slight delay through the now transparent memory stage 22.

The register stage shown in FIG. 4 comprises only two level-triggered memory stages 30 and 32 which are disposed in series for the data signal. The data input of the first memory stage 30 is again preceded by a multiplexer 34, which by means of a select signal on the line 26 couples a first data input 17 or a second data input 19 to a line 35 leading to the data input of the memory stage 30. The clock input of this memory stage receives a clock signal via the line 16.

The memory stage 30 has its output connected to the data input of the memory stage 32 via the line 31. The clock input of the memory stage 32 is connected to the output of a second multiplexer 36 via a line 37, a clock input connected to a clock line 18 or a clock input connected to a line 39 being coupled to the line 37 by the multiplexer depending on a select signal on a line 38 to the select output.

The register stage in FIG. 4 is driven in the same way as the register stage in FIG. 3 but now it is also necessary to switch over between the test mode and normal operation via the line 38.

In the test mode the line 38 receives a signal such that the multiplexer 36 couples the clock line 18 to the clock input of the memory stage 32. To load a test pattern in the shift-register mode, the line 26, as is shown in FIG. 6b, receives a high signal so that the line 19 is coupled to the data input of the memory stage 30. As soon as a pulse appears on the clock line 16 the memory stage 30 is switched to transparent operation and the data signal on the line 19 now appears on the line 31. Upon the end of the pulse on clock line 16, the state of the memory stage 30 is retained and subsequently the memory stage 32 is switched to transparent operation by the pulse on the line 18, so that the transferred data signal now appears on the output 33. Already at the end of the pulse on the clock line 16, possible changes of the data signal on the line 19 can no longer have any effect. Thus it is possible to obtain a reliable shift-register operation.

To load a test result into the register stage, the line 26 supplies a low signal to the select input of the multiplexer 34, so that the data line 17 is now coupled to the data input of the memory stage 30 via the line 35. With the next pulse on the clock line 16, the signal on the data line 7 is loaded into the memory stage 30 while the signal state on the output 33 of the memory stage 30 remains unchanged. It is not until the pulse on the clock line 30 has ended that a pulse is applied via the clock line 18 to switch the memory stage 32 to transparent operation, so that now the signal from the data line 17 appears on the output 33. Again, changes of the data signal on the line 17 no longer have any effect after the end of the pulse on the clock line 17, so that no delay time problems can arise in the transfer of the test results into the register stages.

In normal operation the multiplexer 36 receives a signal on the select input via the line 38 such that the clock input 39 is coupled to the line 37. The clock line 39 receives the inverse of the clock pulses on the clock line 16. As a result, a data signal is loaded into the memory stage 30 upon a pulse on the clock line 16 and on the trailing edge of a pulse this state of the memory stage 30 is retained and at the same time the memory stage 32 is switched to transparent operation, so that the retained state of the memory stage 30 appears on the output 33. Thus, the register stage shown in FIG. 4 behaves as an edge-triggered memory stage, for which the falling edges of the pulses on the clock line 16 are active. However, this is a substantially arbitrary configuration because the pulses on the clock lines 16 and 39 are inverted relative to one another and can also be generated, for example, by an internal inverter stage, not shown, in the register stage.

In contrast with the register stage shown in FIG. 3 the signal state on the clock line 18 in normal operation of the register stage shown in FIG. 4 is not relevant because in this case the multiplexer does not couple this clock line to an output line. However, if in normal operation a suitable select signal on the line 38 switches the multiplexer 36 in such a manner that the clock line 18 is coupled to the line 37 and this clock line is then constantly low the state of the register stage at the output 33 will be preserved independently of signal changes on the data lines. This is effective in order to obtain a temporary stand-by mode with a reduced power dissipation of the integrated circuit. Conversely, if both clock lines 16 and 18 carry a high signal with this setting of the multiplexer 36 all the memory stages 30 and 32 and hence all the register stages are switched to transparent operation, which thus enables all the register stages to be set very rapidly to a uniform initial state.

The register stage shown in FIG. 5 uses three level-triggered memory stages 40, 42 and 46 as well as a further data multiplexer 48 between the memory stages 40 and 46 and 42, respectively, but it does not have a clock multiplexer in one of the clock lines. Depending on a select signal on a line 49 the further multiplexer 48 connects either the output of the memory stage 40 or the output of the memory stage 46 to the data input of the memory stage 42 via the line 45. A first multiplexer 44, which by means of the select signal on the line 49 is switched to test data to be shifted through or to data to be entered from a combinatorial circuit part, is arranged before the data input of the memory stage 46. The operation of the register stage shown in FIG. 5 will now be described in greater detail with reference to the diagram in FIG. 6c. In this diagram the first part again relates to shifting-through of a test pattern. The line 49 receives a high signal with which the data signal from the line 19 is applied to the data input of the memory stage 46. Moreover, the output of this memory stage 46 is coupled to the data input of the memory stage 42 via the multiplexer 48. Upon a pulse on the clock line 18 the data signal on the data line 19 is loaded into the memory stage 46 and then appears on the data input of the memory stage 42 via the line 47, the multiplexer 48 and the line 45, which memory stage 42 is in the storage mode owing to the low signal on the clock line 16 and therefore does not respond to signals on the data input. At the end of the pulse on the clock line 18 the memory stage is set to its storage mode and subsequently a pulse appears on the clock line 16, upon which the memory stage 42 transfers the previously loaded data signal to the output 43. In the case of a suitable spacing between the pulses on the two clock lines 16 and 18 this process is immune to different signal delays of the clock signals for the various register stages.

To enter the test result of a combinatorial circuit part connected to the data line 17 the line 49 first receives a low signal, as a result of which the data line 17 is coupled to the data input of the memory stage 46. The fact that in this situation the output 41 of the memory stage 40 is at the same time coupled to the data input of the memory stage 42 is irrelevant because as a result of the low signal on the clock line 16 the memory stage 42 does not respond to signals on the data input during this time. Upon the next pulse on the line 18 the data signal on the line 17 is loaded into the memory stage 46 and is permanently stored at the end of this pulse. The line 49 now again receives a high signal so that the output of the memory stage 46 is coupled to the data input of the memory stage 42 via the multiplexer 48, and subsequently a pulse appears on the clock line 16, as a result of which the memory stage 42 transfers the signal previously received from the dam line 17 to the output 43. This requires a change of the signal on the line 49 between the two pulses on the clock lines 18 and 16, which can be avoided only if the two multiplexers 44 and 48 are driven with separate select signals. However, this would require an additional line in the integrated circuit, which represents an appreciable complication.

In normal operation the line 49 constantly receives a low signal, so that the output of the memory stage 40 is constantly connected to the data input of the memory stage 42 via the line 41, the multiplexer 48 and the line 45. On its data input the memory stage 40 receives the data signal from the line 17 and the clock input is connected to the clock line 39, which carries a signal which is the inverse of that on the line 16. Thus, in normal operation the register stage shown in FIG. 5 operates similarly to the register stage shown in FIG. 4. The register stage in FIG. 5 can also be set to a low-dissipation mode when the line 49 receives a high signal and the clock line 18 receives a single pulse with which the data signal on the line 17 is loaded into the memory stage 46. If the signal on the line 18 is held low constantly the memory stages 46 and 42 will no longer respond to signal changes on the data line 17, so that the dissipation is reduced and the last significant state of the data line 17 at the output 43 is maintained. Conversely, if both clock lines 16 and 18 carry a high signal with this high signal level on the line 49 all the series-connected register stages can be set very rapidly to a uniform selectable signal state.

A feature common to all the register stage variants described herein is that they can be operated both as edge-triggered register stages and as two-phase clocked register stages, which requires only one additional clock line. The clock line used in normal operation is also used as the second clock phase in the test mode and is thus tested at the same time. In normal operation the register stages are only edge-triggered, which enables a high processing speed to be obtained, whilst the slower two-phase operation is active only in the test mode.

The level-triggered memory stages used in the register stages can be constructed in several ways. FIG. 7 by way of example shows a simple construction. It comprises two series-connected inverter stages 50 and 52 of customary construction and a multiplexer 54 having two data inputs 55 and 57 as well as two control inputs 59 and 59*a*, which receive mutually complementary signals. During operation as memory stage the control signals are formed by clock signals.

The multiplexer 54 has two branches which each comprise an N-channel transistor and a P-channel transistor, marked with a dot at its gate. In one position of the multiplexer 54, when the control input 59 carries a high signal and the control input 59*a* carries a low signal, the input 55 is connected to the output, which leads to the input of the inverter 50, so that a closed loop is formed which has storage capabilities. The lines 51 and 53 supply mutually inverse output signals of the memory stage.

In the other position of the multiplexer 54, when the line 59 carries a low signal and the line 59*a* receives a high signal, there is no longer a closed loop but the data input 57 is connected to the input of the inverter 50 so that now the signals on the lines 51 and 53 follow the signal state at the input 57.

If the inverters 50 and 52 are also constructed in complementary MOS technology the circuit shown in FIG. 7 will exhibit dissipation only during change-over but not in the case of constant signals. FIG. 9, however, shows a variant of a level-clocked memory stage comprising inverters 50 and 52 which are constructed, for example, only by means of N-channel transistors and which also carry a certain current in the rest condition but here the multiplexer 54 is of simpler construction and comprises only one N-channel transistor in one branch and only one P-channel transistor in the other branch. As a result of this, only one control input 59 is needed. If the signal on this control input is high the input 55 of the multiplexer 54 is coupled to the inverter 50 so that again the storage mode is obtained, and if the signal on the control input 59 is low the input 57 of the multiplexer 54 is coupled to the inverter 50 so that the data signal on the input 57 is taken over.

We claim:

1. An integrated circuit comprising a plurality of clocked register stages, each register stage comprising a respective series arrangement of first and second memory stages, the first memory stage being one of an edge-triggered memory stage and a level-triggered memory stage, and the second of the memory stages being the other of the edge and level triggered memory stages each of the first and second memory stages having at least one respective clock input, a respective data input, and a respective data output, a respective first multiplexer preceding the data input of the first memory stage, the respective first multiplexer having a respective select input, at least first and second respective data inputs, and a respective data output, wherein during testing of the integrated circuit the edge-triggered memory stages of the register stages receive a same first clock signal on their respective clock inputs, and the level-clocked memory stages of the register stages receive a same second clock signal, the first and second clock signals having non-overlapping pulses, and for loading and reading-out test signal patterns, each first multiplexer receives a first select signal on the respective select input in order to connect one of the respective data inputs for test signals to the respective data output, and in normal operation, a first signal value is constantly applied to the respective clock input of each level-triggered memory stage of the register stages to switch said level-triggered memory stage to transparent operation.

2. An integrated circuit comprising a plurality of clocked register stages, each register stage comprising a respective series arrangement of first and second level-triggered memory stages, each stage having at least one respective clock input, a respective data input, and a respective output, a respective first multiplexer, preceding the respective data input of the first memory stage of the series arrangement, having a respective select input, at least two respective data inputs, and a respective data output, and a respective second multiplexer, preceding the respective clock input of the second memory stage, having a respective select input, at least two respective data inputs, and a respective data output, wherein during testing of the integrated circuit, the first memory stages receive a same first clock signal on their respective clock inputs, the second multiplexers receive a same second clock signal on a first respective one of the respective clock inputs, the first and second clock signals having non-overlapping pulses, and for loading and reading-out test signal patterns, at least one of the first multiplexers receives a first select signal on its respective select input in order to connect a data input for test signals to the respective data output, and at least one of the second multiplexers receives a second select signal on its respective select input, in order to connect the first clock input to its clock output, and in normal operation, the second multiplexers receive the inverse of the first clock signal on a respective second clock input and the inverse of the second select signal on the respective select inputs in order to connect the second clock input to the respective clock outputs.

3. An integrated circuit comprising a plurality of clocked register stages each register stage comprising a respective series arrangement of first and second level-triggered memory stages each having at least one respective clock input, a respective data input, and a respective output, a respective third similar memory stage, a respective first multiplexer, preceding a data input of the third memory stage, having a respective select input, at least two respective data inputs, and a respective data output, of which a first data input is connected to the respective data input of the respective first memory stage, a respective second multiplexer having a respective select input, first and second respective data inputs, connected to the respective outputs of the respective first and third memory stage, respectively, and a respective data output connected to the respective data input of the respective second memory stage, wherein during testing of the integrated circuit the second memory stages of the register stages receive a same first clock signal on the respective clock inputs, and the third memory stages of the register stages receive a same second clock signal on the respective clock inputs, the first and second clock signals having non-overlapping pulses, and for loading and reading-out test signal patterns, the first and the second multiplexers receive a similar first select signal on the respective select input, in order to couple a data input for tests signals to the respective data input of the third memory stage, and the respective output of the third memory stage to the respective data input of the second memory stage, and for loading test results, the first select signal is inverted at least for a pulse duration of the second clock signal and is not inverted at least for a pulse duration of the first clock signal, and in normal operation the first memory stages receive an inverted version of the first clock signal on their respective clock inputs and the second multiplexers receive an inverted version of the select signal, in order to couple the respective outputs of the first memory stages to the respective data inputs of the second memory stages.

4. An integrated circuit as claimed in claim 1, wherein each level-triggered memory stage comprises a series arrangement of:

a respective second multiplexer, including a respective control input connected to a clock input, and a first input connected to a data input; and respective first and second inverters, a respective output of the second inverter being connected to a second input of the respective second multiplexer a respective input of the first inverter being connected to an output of the respective second multiplexer.

5. An integrated circuit as claimed in claim 2, wherein each level-triggered memory stage comprises a series arrangement of:

a respective third multiplexer, including a respective control input connected to a clock input, and a first input connected to a data input; and respective first and second inverters, a respective output of the second inverter being connected to a second input of the respective third multiplexer a respective input of the first inverter being connected to an output of the respective third multiplexer.

6. An integrated circuit as claimed in claim 3, wherein each level-triggered memory stage comprises a series arrangement of:

a respective third multiplexer, including a respective control input connected to a clock input, and a first input connected to a data input; and respective first and second inverters, a respective output of the second inverter being connected to a second input of the respective third multiplexer a respective input of the first inverter being connected to an output of the respective third multiplexer.

* * * * *